United States Patent [19]

Yu

[11] Patent Number: 5,291,435

[45] Date of Patent: Mar. 1, 1994

[54] READ-ONLY MEMORY CELL

[76] Inventor: Shih-Chiang Yu, 10451 Davison Ave., Cupertino, Calif. 95014

[21] Appl. No.: 1,668

[22] Filed: Jan. 7, 1993

[51] Int. Cl.[5] .............................................. G11C 17/10
[52] U.S. Cl. ..................................... 365/104; 257/390
[58] Field of Search ................. 365/104, 185; 257/390, 257/391

[56] References Cited

U.S. PATENT DOCUMENTS

| | | | |
|---|---|---|---|
| 4,503,519 | 3/1985 | Arakawa | 365/104 |
| 4,554,643 | 11/1985 | Kuo | 257/390 |
| 4,603,341 | 7/1986 | Bertin | 357/23.7 |
| 4,630,089 | 12/1986 | Sasaki et al. | 365/104 |
| 4,630,237 | 11/1986 | Miura | 365/104 |
| 4,707,718 | 11/1987 | Sakai | 357/45 |
| 4,958,317 | 9/1990 | Terada et al. | 365/104 |
| 5,020,025 | 5/1991 | Nix | 365/102 |
| 5,111,428 | 5/1992 | Liang | 365/104 |
| 5,117,389 | 5/1992 | Yiu | 365/104 |

Primary Examiner—Eugene R. LaRoche
Assistant Examiner—Christopher R. Glembocki
Attorney, Agent, or Firm—Kam T. Tam

[57] ABSTRACT

A Read-Only semiconductor memory cell includes: a semiconductor substrate and a source and a drain formed on one surface of the substrate; a channel region, which is in between source and drain regions on the surface of the substrate, is controlled by X-control gate XCG and Y-control gate YCG which are formed on the surface of the substrate and isolated from each other and from source and drain regions and from semiconductor substrate through insulating films. Multiple levels of threshold voltages of the cells exist for ROM codes. The cell structure provide a means for accurate cell current during read, and is simpler for peripheral control circuit design and is contactless, fieldless, suitable for high reliable Mega-bit memory devices.

5 Claims, 6 Drawing Sheets

READ-ONLY MEMORY CELL

BACKGROUND OF THE INVENTION

1. Field of the Invention

The present invention relates to semiconductor memory devices, and in particular, to Read-Only Memory (ROM) cell and the method for manufacturing the same.

2. Prior Art

Various elements, such as fuses, diodes, and transistors have been used on semiconductor substrate to implement the storage of bit contents of 0's and 1's for computing, communication, data processing, and information storage. A simple method is to have or not to have fuse or diode links between each address lines and data lines that determines the states of 0's and 1's. At the transistor level, more variations have been reported. For examples, enhancement type transistors and depletion type transistors are arranged on rows and columns to differentiate between 0's and 1's of the Read-Only memory cell contents, or ROM codes. The existence of contacts or not on the drain areas of the transistors is another way to do it. Furthermore, two types of transistors of low and high threshold voltages can be used also.

As the density of the bits per chip increases, ROM cells become smaller and smaller and structures become simpler. One cell that is compact and small is generally called "Flat Cell". FIG. 1a is a top plan layout view of a partial array arrangement represented by six such cells, C1 C2 . . . through C6. The cross sectional views taken along lines 1b—1b and 1c—1c of FIG. 1a are shown in FIG. 1b and FIG. 1c respectively. Such a cell includes a P-type Silicon substrate 10 having N+ diffusion bitlines 12 on the surface of the substrate 10 thereof. In between each adjacent N+ diffusion bitlines 12 are the channel regions 14. ROM codes are implemented by implanting some of the channel regions 14 of the transistors to a higher threshold voltages for storing 0's together with lower threshold transistors for storing 1's. Polysilicon wordlines 18 formed on an insulating film 16 over the channel regions 14 and N+ diffusion bitlines 12. P+ implanted regions 20 are used for cell isolation. The schematic diagram of the six cells shown in FIG. 1a is shown in FIG. 2. Such Flat Cell offer excellent packing density and simple in cell arrangement. However, such cell requires rather complicated controls of the peripheral circuitry, see for examples, Okada, et al., "16 Mb ROM Design Using Bank Select Architecture", Symposium on VLSI Circuits, Tokyo, Japan, Aug. 22-24 1988, Digest of Technical Papers, pp. 85-86, or T. Yiu, U.S. Pat. No. 5,117,389, issued May 26, 1992. Also, a very sensitive sense amplifier design is necessary to read the cell current and critical process control in order to match the design tolerance.

SUMMARY OF THE INVENTION

It is accordingly an object of the present invention to provide a Read-Only memory cell that is simple for peripheral control circuitry and more reliable cell current.

These and other objects of the present invention are accomplished by providing an improved design of a Read-Only memory cell which has an improved cell structure.

According to this invention, there is provided a Read-Only semiconductor memory cell comprising: a semiconductor substrate of a first conductivity type; source and drain diffusion regions of second conductivity type different from the first conductivity type formed within said substrate; a channel region provided between said source and drain regions; a first insulating film formed on said substrate; a Y-control gate formed on said first insulating film and overlying a portion of said channel region and a portion of said source region; An X-control gate is formed on insulating film overlying said Y-control gate, a portion of said channel region, and said source and drain regions. Isolation between said source and drain regions not covered by X-control gate and Y-control gate is accomplished by implanting ions of the first conductivity type or by relatively thick oxide isolation, or by oxide filled trench isolation.

Additional objects and features of the present invention will become more apparent in the following description.

BRIEF DESCRIPTION OF THE DRAWINGS

FIG. 1b is the cross sectional view taken along line 1b—1b of FIG. 1a.

FIG. 1c is the cross sectional view taken along line 1c—1c of FIG. 1a.

FIG. 3 is a top plan layout view of the preferred embodiment of the present invention.

FIG. 3b is the cross-sectional view taken along line 3b—3b of FIG. 3a.

FIG. 3c is the cross-sectional view taken along line 3c—3c of FIG. 3a.

FIG. 5 is a top plan layout view of partial array arrangement of eight cells of the preferred embodiment of the present invention.

FIG. 5b is the cross-sectional view taken along line 5b—5b of FIG. 5a.

FIG. 5c is the cross-sectional view taken along line 5c—5c of FIG. 5a.

FIG. 8b is the cross-sectional view taken along line 8b—8b of FIG. 8a.

FIG. 8c is the cross-sectional view taken along line 8c—8c of FIG. 8a.

FIG. 9b is a cross sectional view taken along line 9b—9b of FIG. 9a.

DESCRIPTION OF THE PREFERRED EMBODIMENT

Figure 1A:
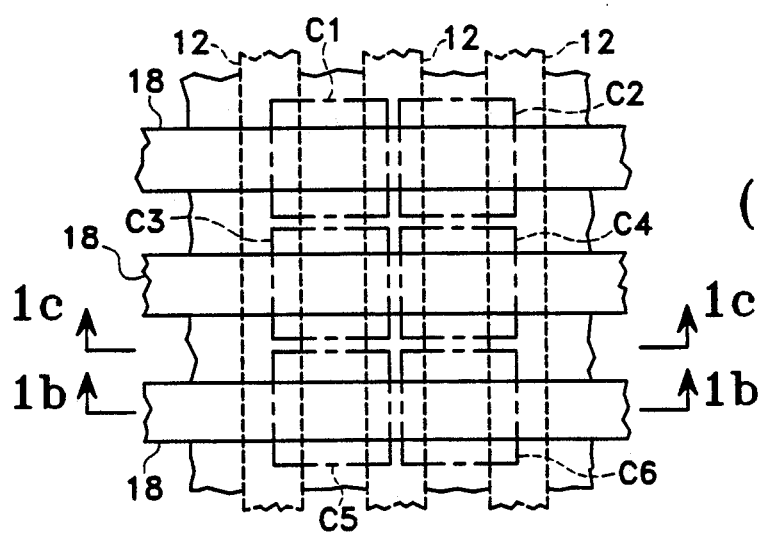
FIG. 1a is a top plan layout view of a partial array arrangement including six Flat Cells.
Figure 1B:
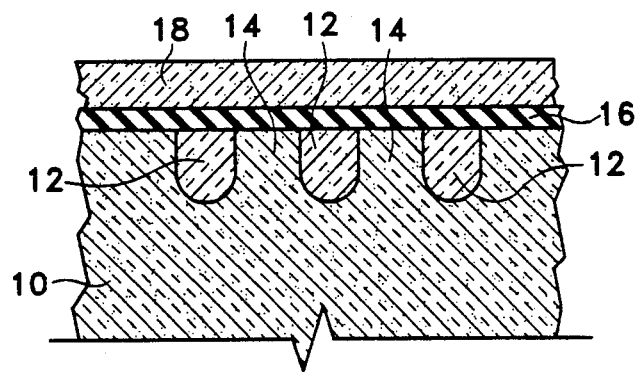
Figure 1C:
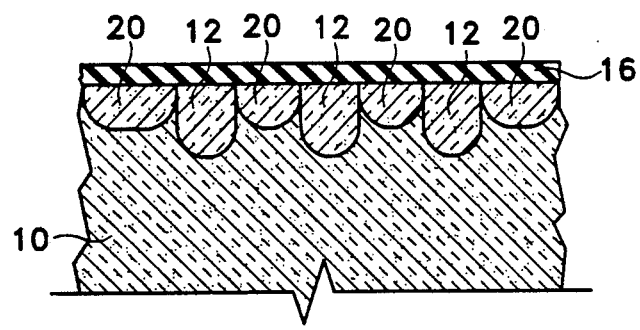
Figure 2:
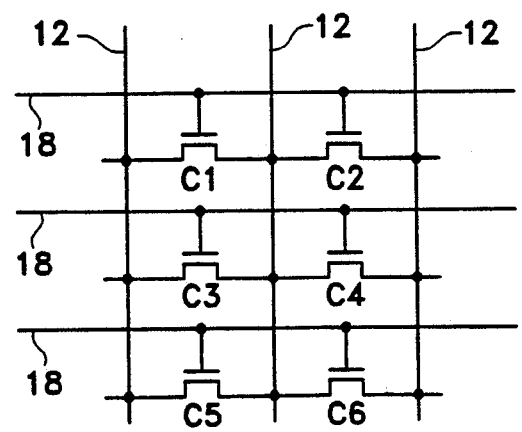
FIG. 2 is a schematic representation of an equivalent circuit of the partial array arrangement shown in FIG. 1(a).
Figure 3A:
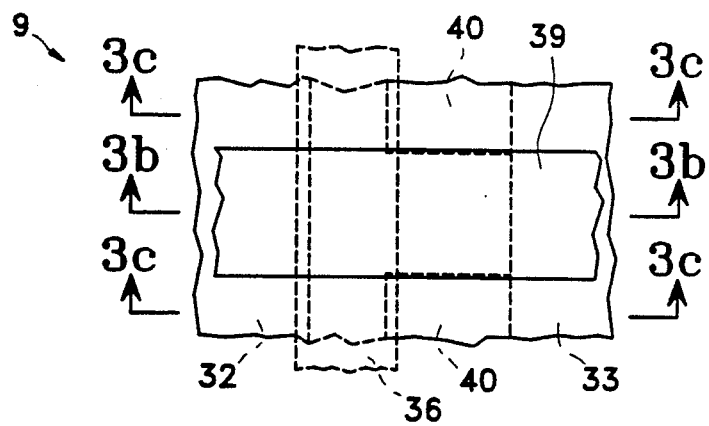
Figure 3B:
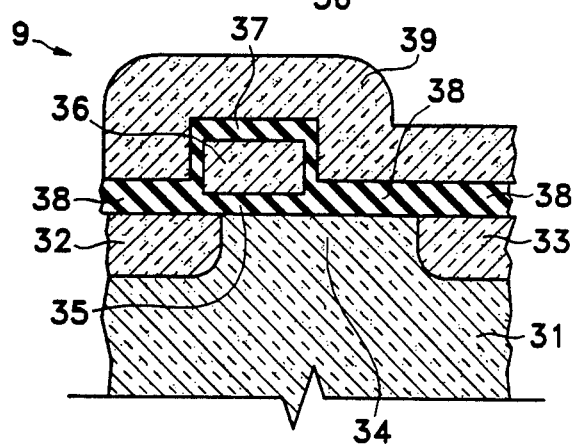
Figure 3C:
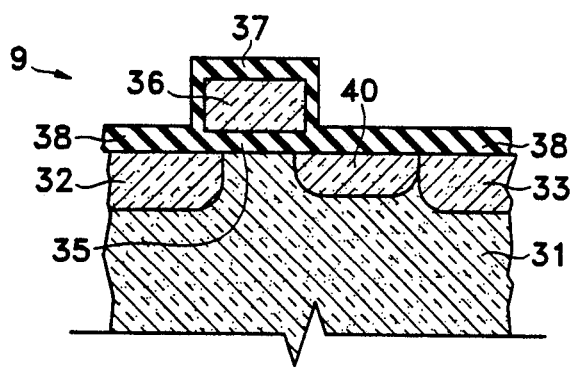

A preferred embodiment according to the present invention is described with reference to the accompanying drawings. FIG. 3a is a plan layout view of the Read-Only Memory cell according to the present invention, the cross sectional view taken along line 3b—3b is shown in FIG. 3b, FIG. 3c is a cross sectional view along line B-B'. In this embodiment, formed within a semiconductor substrate 31, for example, a p-type silicon substrate are N+ diffusion source 32 and drain 33 spaced apart on the surface thereof. A channel region 34 is provided in between source 32 and drain 33 regions on the surface of said substrate. A Y-control gate 36 formed over an insulating film 35 overlying a portion of the channel region 34 and a portion of N+ diffusion source 32. An X-control gate 39 is formed on an insulating film 37 overlying Y-control gate and on an insulating film 38 overlying the rest of the channel region 34 and N+ diffusion drain 33 and source 32. Isolation between drain 33 and source 32 regions on the surface of the substrate 31 that are not covered by X-control gate 39 and Y-control gate 36 is accomplished by P+ region 40.

Figure 4:
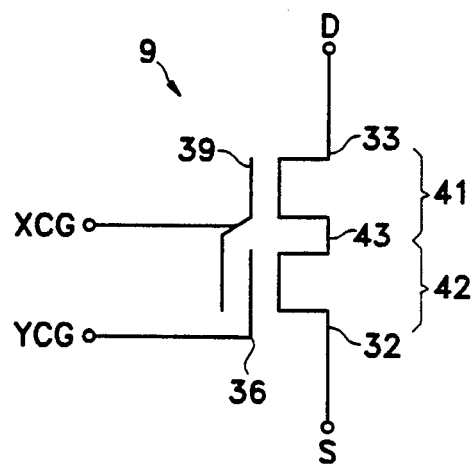
FIG. 4 is a terminal diagram of an equivalent circuit in accordance with the present invention shown in FIG. 3.

To arrange each cell in memory cell array, N+ diffusion source 32 is connected to a source line S, N+ diffusion drain 33 is connected to a drain line D, Y-control gate 36 is connected to a Y-control gate line YCG and X-control gate 39 is connected to an X-control gate line XCG as shown in FIG. 4 which is a terminal diagram of an equivalent circuit of the present invention cell shown in FIG. 3. In this diagram, the cell has been functionally divided into two transistors 41 and 42. Transistor 41 is controlled only by X-control gate 39 only. Transistor 42 is controlled by Y-control gate 36 only. The inter-connect point 43 does not physically exist, but explains theoretically the operation of the cell.

In the read operation, voltages of +3 V, +3 V, +3 V and 0 V are applied to the selected drain line D, X-control gate line XCG, Y-control gate line YCG, and source line S respectively. If the cell threshold voltage VT is +5 V, channel 34 is not turned on which may be used for storing "0". In another case, if the cell threshold voltage VT is +1 V, both transistors 41 and 42 are turned on, current will flow under the voltages applied at read operation which may be used for storing "1". Under read operation the cells that share the same X-control gate line will not conduct current because the Y-control gate lines of these cells are at zero volt. The same is true for the cells that share the same drain line because X-control gate lines are at zero volt. So, the current, if any, comes out of the selected cell is the current and only the current from the cell.

Figure 5A:
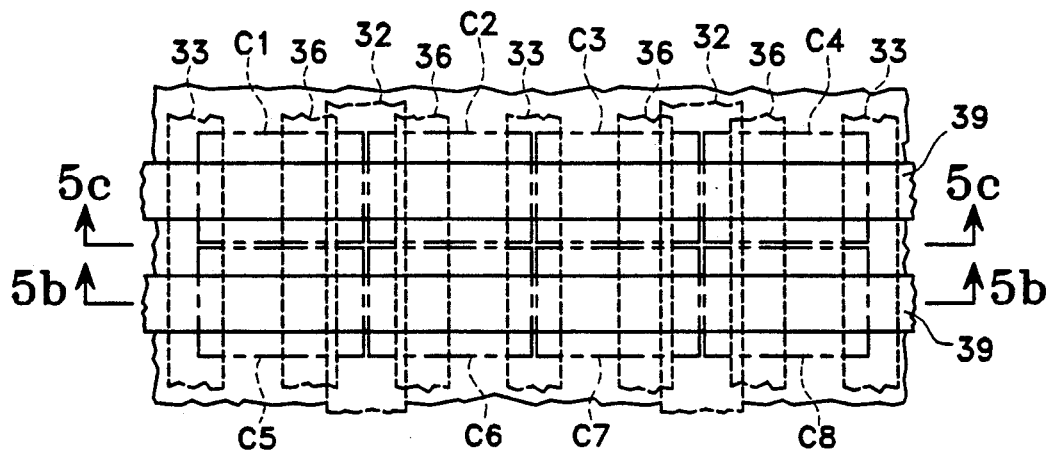
Figure 5B:
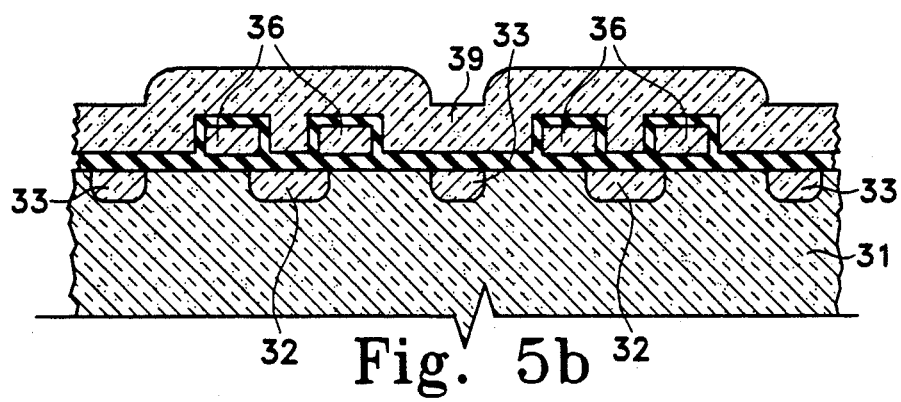
Figure 5C:
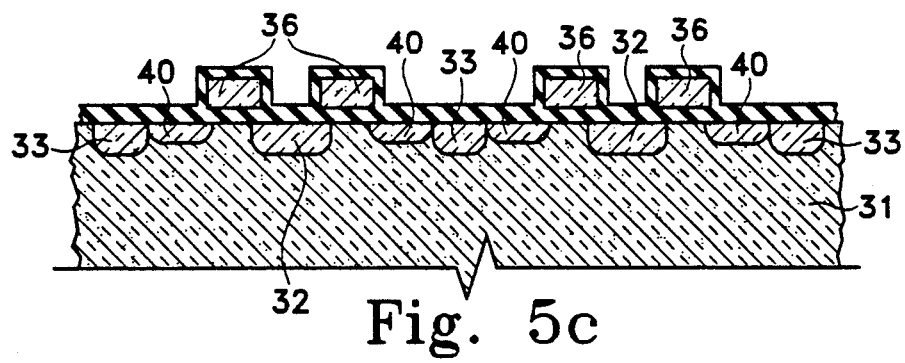
Figure 6:
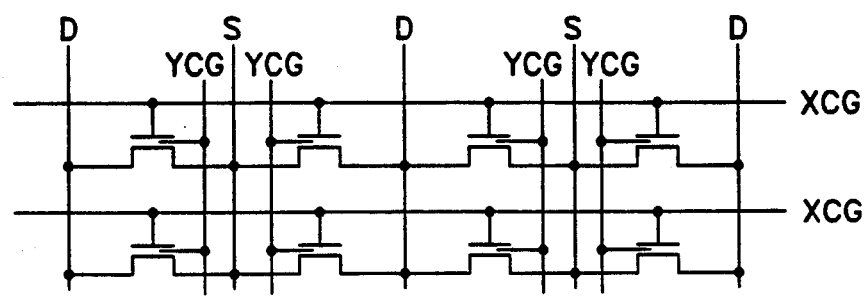
FIG. 6 is the schematic diagram representing the cell arrangement shown in FIG. 5(a).

FIG. 5a is a plan view of one example of cell arrangement represented by eight cells, C1 to C8, in accordance with the cell of the present invention shown in FIG. 3a FIG. 5c is the cross sectional views taken along line 5b—5b shown in FIG. 5a, while FIG. 5c is the corresponding drawing taken along line 5c—5c of FIG. 5a. Such arrangement has the benefit of common source regions 32. Therefore, peripheral circuits related to control of alternating drain regions 33 and source regions 32 are not necessary any more. FIG. 6 shows the schematic diagram representing the cell arrangement shown in FIG. 5a.

Figure 7A:
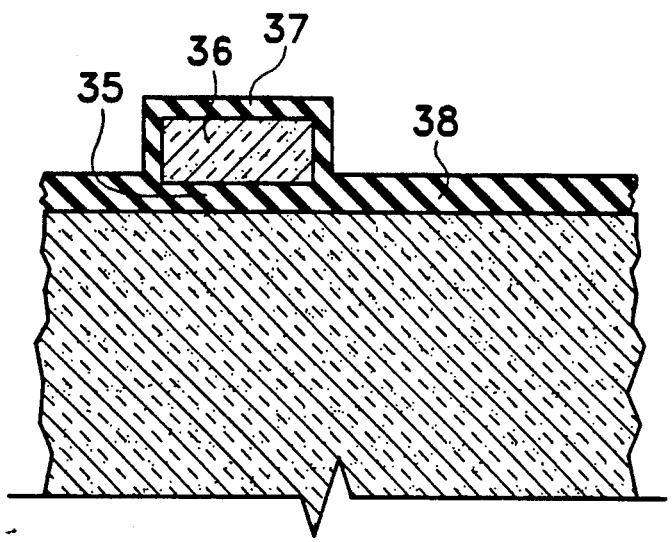
FIGS. 7a-7b are cross-sectional views illustrating the fabrication process of the preferred embodiment of the present invention at various stages.
Figure 7B:
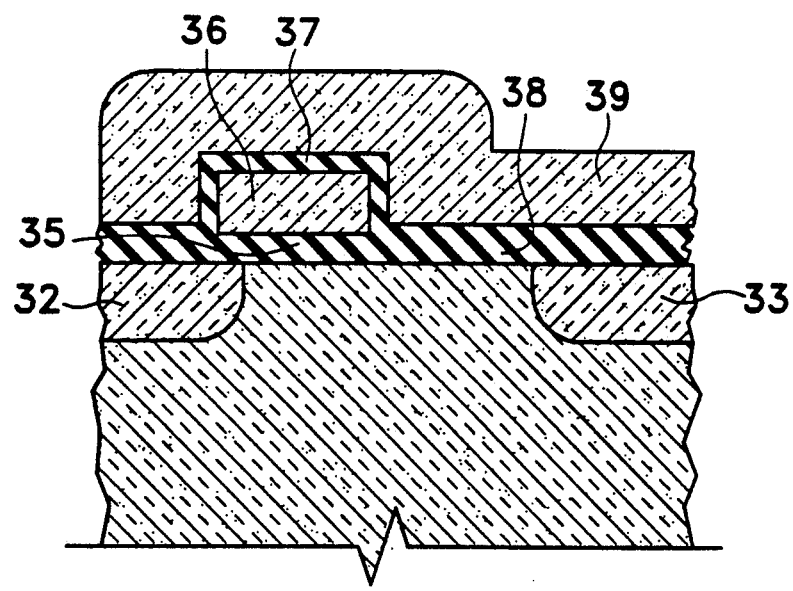

FIGS. 7a and 7b show cross sectional views of one example of a fabrication process in building the memory cell in accordance with the present invention shown in FIG. 3 at various stages. A number of process steps which may relate to create transistors peripheral to the cells are not described herein. First polysilicon of 450 nanometers is deposited and doped to a resistance of 4 Ohms after oxidation of a P-type silicon substrate to a thickness of 20 nanometers for forming first insulating film 35. Photomasking and etching steps are done to define Y-control gate 36. Another oxidation is done to form second isolating film 37 on the first polysilicon and insulating film 38 on substrate. FIG. 7a shows the cross sectional view of the cell built up to this step. Photomasking and implant steps are then performed to define source region 32 and drain region 33. Second polysilicon of 450 nanometers is then deposited and doped to form a conductor which is masked and etched to form X-control gate 39. FIG. 7b shows the cross sectional structure built up to this step. For proper isolation between two adjacent cells, P+ regions 40 are implanted with boron ions which is shown in FIG. 3c.

X-control gate can also be other materials such as Tungsten Silicide, Titanium Silicide, and other refractory Silicide materials etc.

Figure 8A:
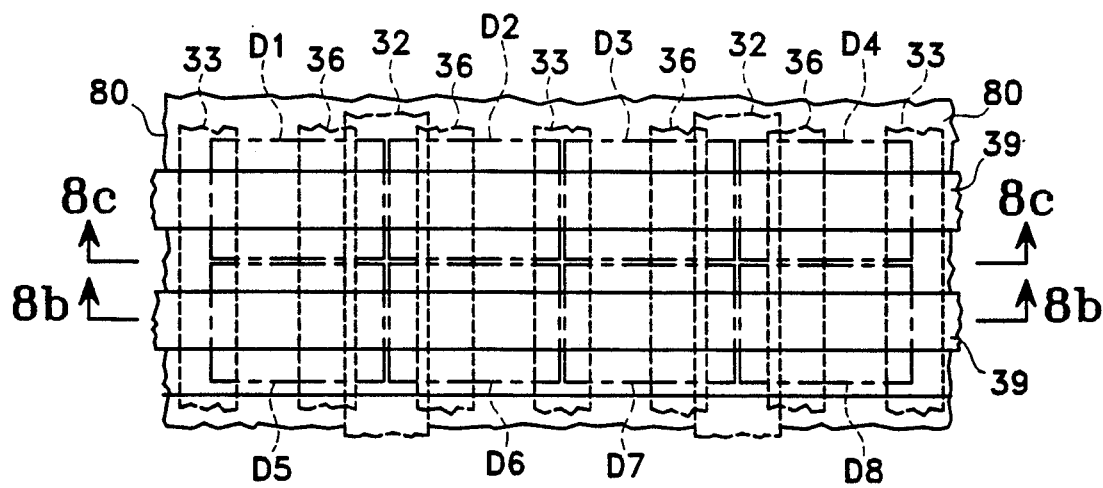
FIG. 8a is the top plan layout view of a partial cell array including eight cells of the second embodiment of the present invention.
Figure 8B:
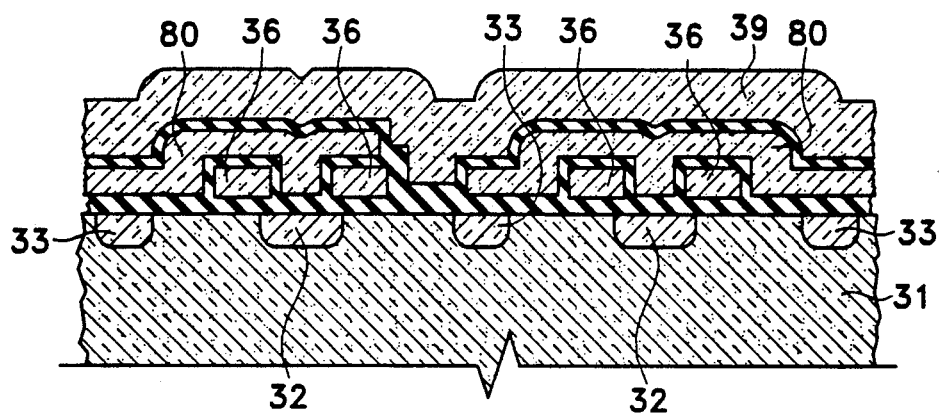
Figure 8C:
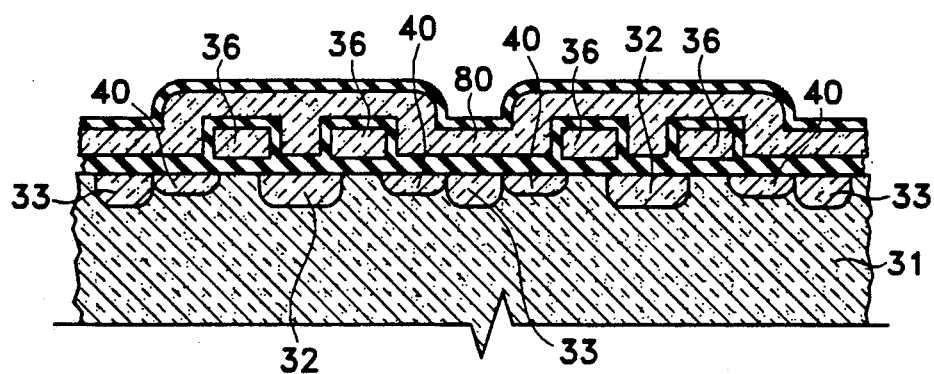
Figure 9A:
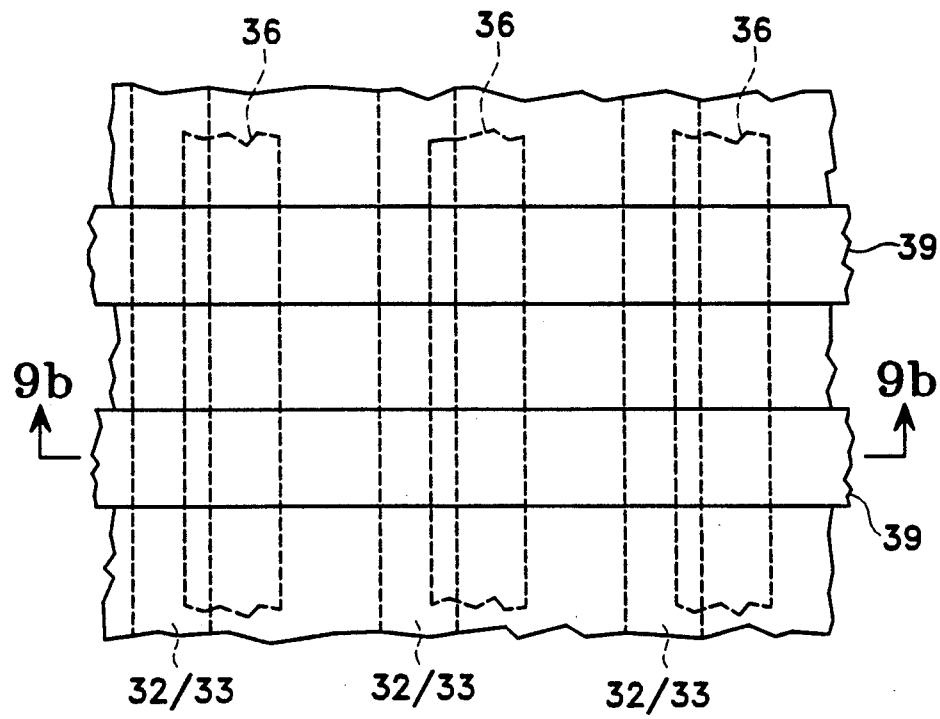
FIG. 9a is a plan layout view of a partial cell array of the cell of the preferred embodiment of the present invention with a different arrangement.
Figure 9B:
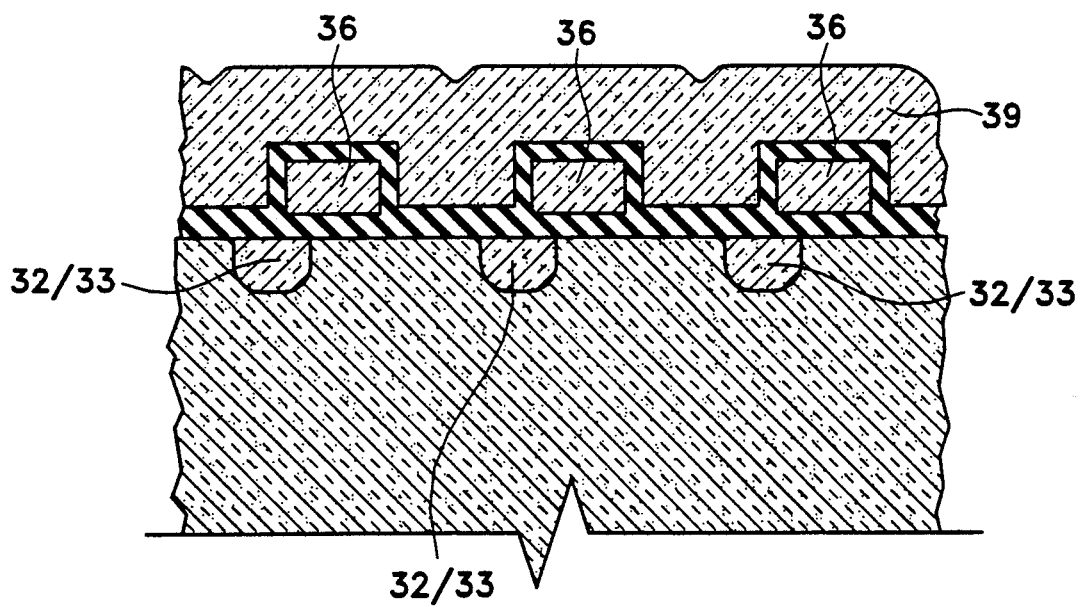

With this example embodiment of the present invention, the above description is not to be construed in a limiting sense. Various modifications of this example embodiment as well as other embodiments of the present invention will be apparent to persons skilled in the art. For examples, field oxide can easily be added in for cell isolation, oxide-nitride-oxide insulating films can be used for replacing oxide insulating films 37. Materials and shapes for said X-control gate 39 and Y-control gate 36, first insulating film 35, and second insulating film 37, may be changed from those illustrated with reference to the figures. ROM codes can be implemented by using field oxide as used for peripheral transistor isolation to replace the channel region for storing 0's and normal transistor as shown in FIG. 3 for storing 1's. ROM codes can also be implemented by putting an extra plane of Polysilicon film 80, see FIG. 8, in between X-control gate and Y-control gate and between X-control gate and channel region and isolated from X-control gate, Y-control gate and channel region by insulating films. For storing 1's there will be holes on the Polysilicon plane 80 such that the cells have exactly the structure shown in FIG. 3, for storing 0's the polysilicon plane which is on part of the channel of the cell is at zero volt blocks the voltage on X-control gate for turning on the channel of the cells. FIG. 8a shows the plan layout view of such embodiment represented by eight cells, D1 to D8. Cell D6 represents the stored "1" with the rest of the cells as stored "0"'s. The cross sectional views along lines 8b—8b and 8c—8c FIG. 8a is shown in FIG. 8b and FIG. 8c. FIG. 9a shows an cell arrangement of variation to the preferred arrangement shown in FIG. 5a. FIG. 9b shows a cross sectional view of the varied embodiment taken along line 9b—9b of FIG. 9a. This arrangement requires switching of drain lines and source lines hence the labels of 32/33. Such modifications and embodiments are useful and fall within the scope of the present invention.

What is claimed is:

1. A Read-Only semiconductor memory cell comprising;
    a semiconductor substrate of a first conductivity type;
    a source and a drain diffusion regions of second conductivity type different from first conductivity type, spaced apart on the surface of said substrate;
    a channel region between said source and drain regions on the surface of said substrate;
    a first insulating film formed on said substrate;

a Y-control gate formed on said first insulating film and overlying a portion of said channel region and a portion of said source region;

a second insulating film covers said Y-control gate, channel region, and source and drain diffusion regions;

an X-control gate formed on said second insulating film overlying Y-control gate, a portion of the channel region, and source and drain regions;

a diffusion region of first conductivity type formed on the surface of said substrate which is between said drain and said source regions but not covered by either of said X-control gate or said Y-control gate.

2. A read-Only semiconductor memory cell according to claim 1, wherein said Y-control gate and said X-control gate are conducting materials.

3. A Read-Only semiconductor memory cell according to claim 1, where ROM codes are implemented by implanting ions of said first conductivity type into the channel region, such that multiple levels of threshold voltages exist.

4. A Read-Only Memory cell array according to claim 1, wherein a plurality of said memory cells are arranged in a matrix form.

5. A Read-Only Memory cell array according to claim 1, wherein a plurality of said memory cells are arranged in a matrix form; said X-control gates are arranged in a first direction and form X-control gate lines; and, said Y-control gates, said sources, and said drains are arranged in a second direction which is different from said first direction and form Y-control gate lines, source lines, and drain lines.

* * * * *